(12) United States Patent
Kurosawa

(10) Patent No.: US 11,275,309 B2
(45) Date of Patent: Mar. 15, 2022

(54) FILM FORMING APPARATUS, FILM FORMING METHOD, AND METHOD OF MANUFACTURING ARTICLE

(71) Applicant: CANON KABUSHIKI KAISHA, Tokyo (JP)

(72) Inventor: Hiroshi Kurosawa, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 131 days.

(21) Appl. No.: 16/597,950

(22) Filed: Oct. 10, 2019

(65) Prior Publication Data
US 2020/0117096 A1  Apr. 16, 2020

(30) Foreign Application Priority Data
Oct. 11, 2018 (JP) .............................. JP2018-192812

(51) Int. Cl.
*G03F 7/20* (2006.01)
*G03F 7/16* (2006.01)
*G03F 7/26* (2006.01)

(52) U.S. Cl.
CPC .......... *G03F 7/70058* (2013.01); *G03F 7/162* (2013.01); *G03F 7/168* (2013.01); *G03F 7/20* (2013.01); *G03F 7/26* (2013.01)

(58) Field of Classification Search
None
See application file for complete search history.

(56) References Cited

U.S. PATENT DOCUMENTS

| 5,434,107 A | 7/1995 | Paranjpe |
| 7,455,955 B2 | 11/2008 | Shih et al. |
| 2001/0036749 A1 | 11/2001 | Levert et al. |
| 2003/0189273 A1* | 10/2003 | Olsson ................. B29C 59/022 264/293 |
| 2005/0064054 A1* | 3/2005 | Kasumi ................. B82Y 40/00 425/112 |
| 2008/0153405 A1 | 6/2008 | McCutcheon et al. |

(Continued)

FOREIGN PATENT DOCUMENTS

| EP | 0665580 A2 | 8/1995 |
| EP | 1553620 A1 | 7/2005 |
| JP | 2011-199232 A | 10/2011 |

(Continued)

OTHER PUBLICATIONS

Partial search report dated Jun. 16, 2020, in corresponding EP application No. 19200694.8 (13 pages).

(Continued)

*Primary Examiner* — Jethro M. Pence
(74) *Attorney, Agent, or Firm* — Venable LLP

(57) ABSTRACT

A film forming apparatus for forming a film on a substrate includes a driver configured to bring a curable composition arranged on the substrate and a flat surface into contact with each other, a heater configured to heat the curable composition by electromagnetic waves to reduce the viscosity of the curable composition and make the curable composition conform to the flat surface, and a curing device configured to form a film made of a cured product of the curable composition by curing the curable composition in a state in which the curable composition conforms to the flat surface.

26 Claims, 8 Drawing Sheets

(56) References Cited

U.S. PATENT DOCUMENTS

2009/0309253 A1 12/2009 Lin
2015/0224705 A1 8/2015 Treiblmayr

FOREIGN PATENT DOCUMENTS

TW 200834725 A 8/2008
WO 2014/045803 A1 3/2014

OTHER PUBLICATIONS

Extended European Search Report dated Nov. 16, 2020, in counterpart EP Application No. 19200694.8 (18 pages).
Office Action dated Dec. 13, 2021, in counterpart TW Application No. 108135815 (19 pages).

* cited by examiner

FILM FORMING APPARATUS, FILM FORMING METHOD, AND METHOD OF MANUFACTURING ARTICLE

BACKGROUND OF THE INVENTION

Field of the Invention

The present invention relates to a film forming apparatus, a film forming method, and a method of manufacturing an article.

Description of the Related Art

A photolithography technique is used in the manufacture of an article such as a semiconductor device. A photolithography technique includes a process of forming a latent image pattern by using an exposure apparatus to transfer the pattern of an original to a photoresist film arranged on a substrate, and forming a resist pattern by developing the latent pattern. Along with the advancement of the resolution of exposure apparatuses, the depth of focus of a projection optical system of an exposure apparatus has become extremely narrow. For example, in a scanning exposure apparatus that is used to form a line-and-space pattern of 5 to 7 nm, the three-dimensional accuracy required for an exposure slit is 4 nm or less. Hence, a planarizing film is formed on an underlying pattern which is present on the surface of a substrate, and a photoresist film can be arranged on the planarizing film.

U.S. Pat. No. 7,455,955 discloses a method in which a planarizing layer is formed on a substrate which includes a topographic feature, and the planarizing layer is cured by bringing a flat surface into contact with the planarizing later. The contact between the planarizing layer and the flat surface is performed for a time, at a pressure, and at a temperature sufficient enough to transfer the flatness of the flat surface onto the planarizing surface. U.S. Pat. No. 7,455,955 discloses that the temperature at the time of contact typically falls within the range of 350° C. from the environmental temperature. However, U.S. Pat. No. 7,455,955 does not disclose what kind of method can be used to heat the planarizing layer during the process of bringing the flat surface into contact with the planarizing layer.

SUMMARY OF THE INVENTION

The present invention provides a technique advantageous in efficiently forming a planarized film on a substrate.

One of aspects of the present invention provides a film forming apparatus that forms a film on a substrate, comprising: a driver configured to bring a curable composition arranged on the substrate and a flat surface into contact with each other; a heater configured to heat the curable composition by electromagnetic waves to reduce the viscosity of the curable composition and make the curable composition conform to the flat surface; and a curing device configured to form a film made of a cured product of the curable composition by curing the curable composition in a state in which the curable composition conforms to the flat surface.

Further features of the present invention will become apparent from the following description of exemplary embodiments with reference to the attached drawings.

DESCRIPTION OF THE EMBODIMENTS

Exemplary embodiments of a film forming apparatus and a film forming method of the present invention will be described hereinafter with reference to the accompanying drawings.

Figure 1:
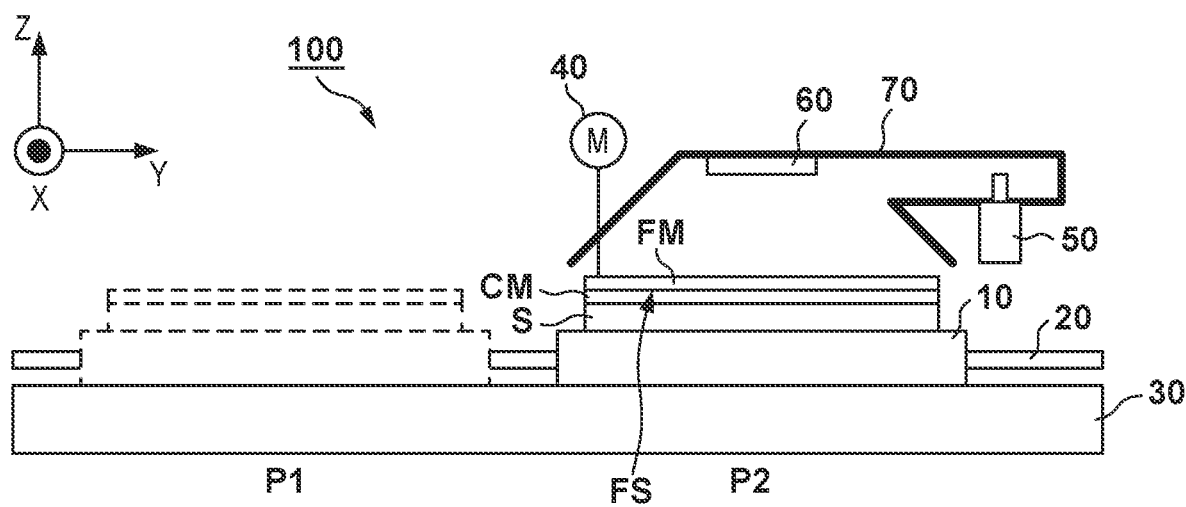
FIG. 1 is a view showing the arrangement of a film forming apparatus according to the first embodiment of the present invention.

FIG. 1 shows the arrangement of a film forming apparatus 100 according to the first embodiment of the present invention. The film forming apparatus 100 forms a film made of a curable composition CM on a substrate S. The film forming apparatus 100 can include, for example, a driver 40, a heater 50, and a curing device 60. Although this film is a planarized film, it need not be completely flat. The driver 40 drives at least one of the substrate S and a flat member FM to bring the curable composition CM arranged on the substrate S and a flat surface FS of the flat member FM into contact with each other. In addition, the driver 40 can drive at least one of the substrate S and the flat member FM to separate the film made of a cured product of the curable composition CM from the flat surface FS of the flat member FM after the curable composition CM has been cured. In the example shown in FIG. 1, the driver 40 is formed to perform a contact operation and a separation operation between the curable composition CM and the flat surface FS by driving the flat member FM. Also, although a description has been omitted in FIG. 1, the flat member FM can be held by a holding head. The driver 40 can drive the flat member FM by driving the holding head.

The heater 50 can use electromagnetic waves to heat the curable composition CM to reduce the viscosity of the curable composition CM and make the curable composition CM conform to the flat surface FS. The heating of the curable composition CM by the heater 50 may be started before the driver 40 brings the curable composition CM and the flat surface FS of the flat member FM into contact with each other or started after the driver 40 has brought the curable composition CM and the flat surface FS of the flat member FM into contact with each other. The heater 50 can heat the curable composition CM at least during the period in which the curable composition CM is in contact with the flat surface FS of the flat member FM. The heater 50 can include a magnetron. The magnetron can generate, for example, electromagnetic waves that have a frequency of 2.45 GHz or 0.915 GHz. The film forming apparatus 100 includes a cover member 70 that can cover the entire substrate S and has an opening portion, and the heater 50 can be arranged so as to irradiate the curable composition CM on the substrate S with electromagnetic waves through the opening portion of the cover member 70. The cover member 70 can be made of, for example, an electrically conductive member such as a metal or the like. At least a part of the cover member 70 can form a waveguide or a waveguide tube for transporting the electromagnetic waves.

The curing device 60 cures the curable composition CM in a state in which the curable composition CM on the substrate S conforms to the flat surface FS of the flat member FM. As a result, a film made of the cured product of the curable composition CM is formed on the substrate S. The film can have a flat upper surface conforming to the flat surface FS. The curable composition CM is, for example, a material that is cured by ultraviolet irradiation, and the curing device 60 can cure the curable composition CM by irradiating the curable composition CM with ultraviolet light. The curing device 60 can irradiate the curable composition CM with ultraviolet light via the flat member FM.

The substrate S can include a plurality of shot regions, and the flat surface FS of the flat member FM can be of a size that can cover the entire plurality of shot regions. As a result, a film made of a cured product of the curable composition CM can be formed at once on the entire substrate S. However, the curing of the curable composition CM on the substrate S may proceed for each partial region. Alternatively, the curing of the curable composition CM on the substrate S may be performed so that the cured region will expand gradually or stepwise.

The film forming apparatus 100 can further include a moving mechanism 20 that arranges a substrate holder 10 at a first position P1 and a second position P2. The substrate holder 10 can be driven, conveyed, or positioned by, for example, the moving mechanism 20 while being supported by a base member 30. The first position P1 can be a position where the substrate holder 10 receives the substrate S from a conveyance mechanism (not shown). Also, the first position P1 can be a position where the substrate holder 10 transfers the substrate S to the conveyance mechanism (not shown). The second position P2 can be a position where the curing device 60 cures the curable composition CM. Also, the second position P2 can be a position where the driver 40 brings the curable composition CM on the substrate S and the flat surface FS of the flat member FM into contact with each other and separates the cured product of the curable composition CM and the flat surface FS from each other after the curable composition CM has been cured. The second position P2 can also be a position where the heater 50 heats the curable composition CM. The conveyance mechanism (not shown) supplies the substrate S to which the curable composition CM has been applied by a coater such as a spin coater or the like to the substrate holder 10 which is arranged on the first position P1.

A film forming method that can be performed by the film forming apparatus 100 will be exemplified with reference to FIGS. 2A to 2C, 3A to 3C, 4A to 4C, and 5A to 5C hereinafter. FIGS. 2A to 2C and 3A to 3C show an example of a film forming method that can be performed by the film forming apparatus 100. FIGS. 4A to 4C and 5A to 5C show an example of the structure of the substrate S, the changes in the curable composition CM, the contact and the separation between the curable composition CM and the flat surface FS of the flat member FM, and the like in the film forming method that can be performed by the film forming apparatus 100.

Figure 4A:
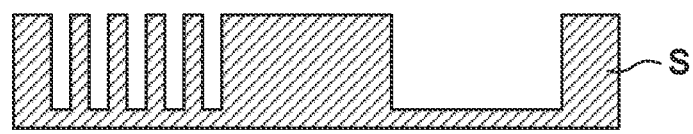
FIGS. 4A to 4C are views exemplarily showing a structure of a substrate, changes in a curable composition, contact and separation between the curable composition and a flat surface of a flat member, and the like in the film forming method that can be performed by the film forming apparatus according to the first embodiment of the present invention.
Figure 4B:
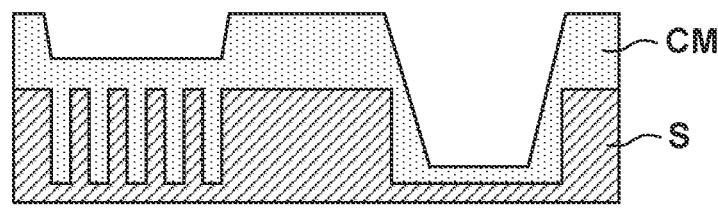

First, as shown in FIG. 4A, the substrate S which has a three-dimensional pattern on the surface is prepared, and the curable composition CM is subsequently applied or arranged on the substrate S by a coater such as a spin coater or the like (not shown) as shown in FIG. 4B. The curable composition CM can be, for example, a SOC resist which is cured by ultraviolet irradiation. In this case, an adhesion layer may be applied on the substrate S before the curable composition CM is applied on the substrate S. The adhesion layer has an effect of strengthening the bond between the substrate S and the cured product of the curable composition CM.

Figure 2A:
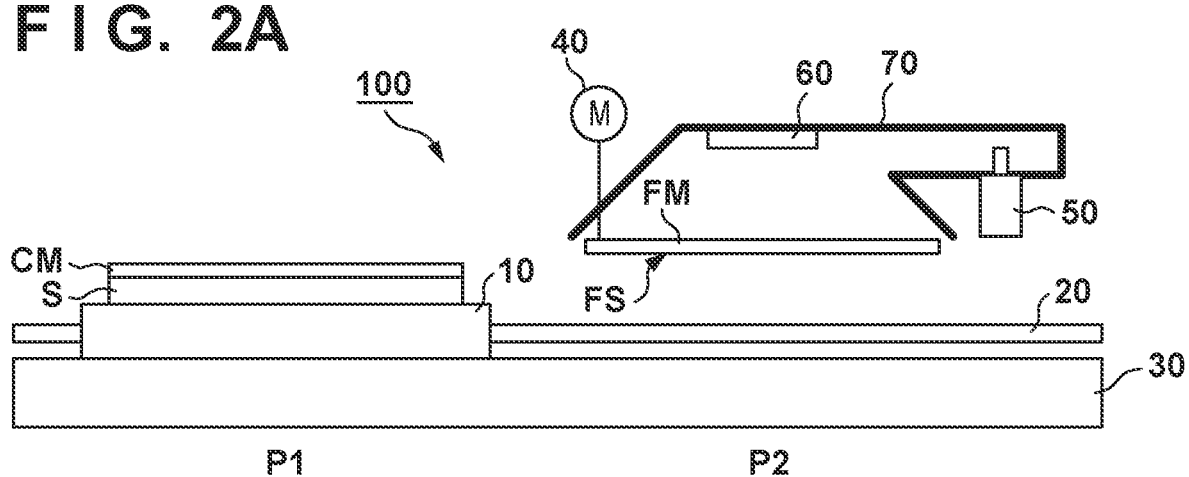
FIGS. 2A to 2C are views exemplarily showing a film forming method that can be performed by the film forming apparatus according to the first embodiment of the present invention.
Figure 2B:
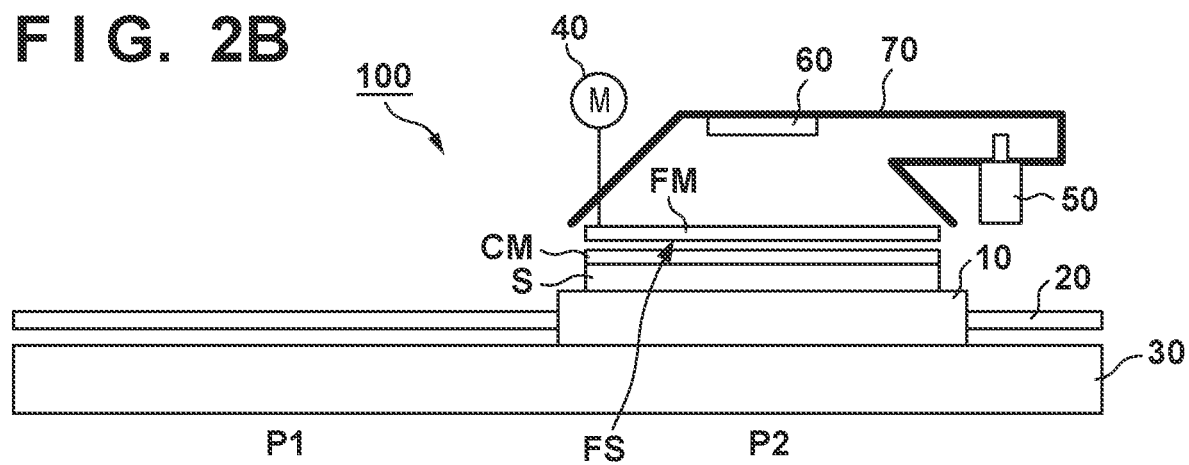
Figure 2C:
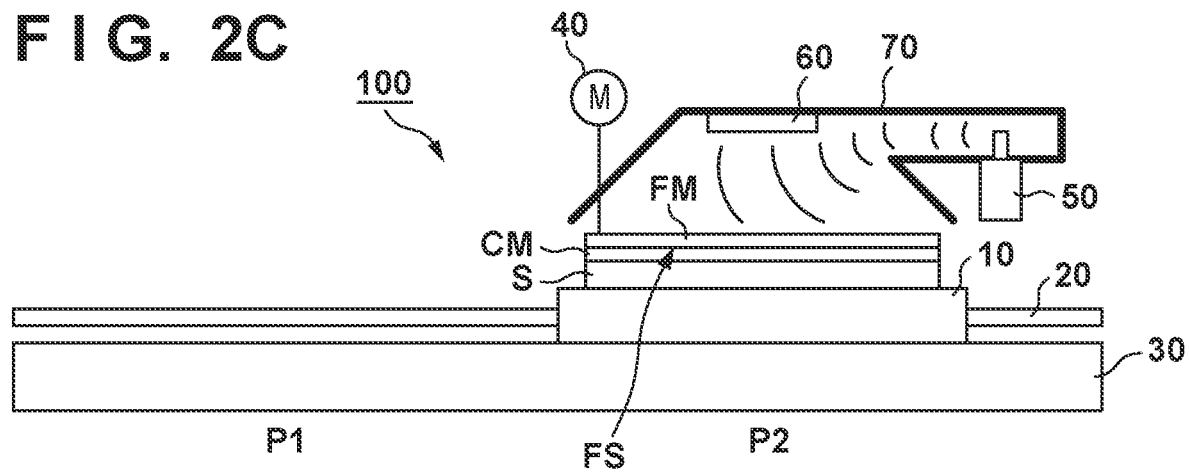
Figure 4C:
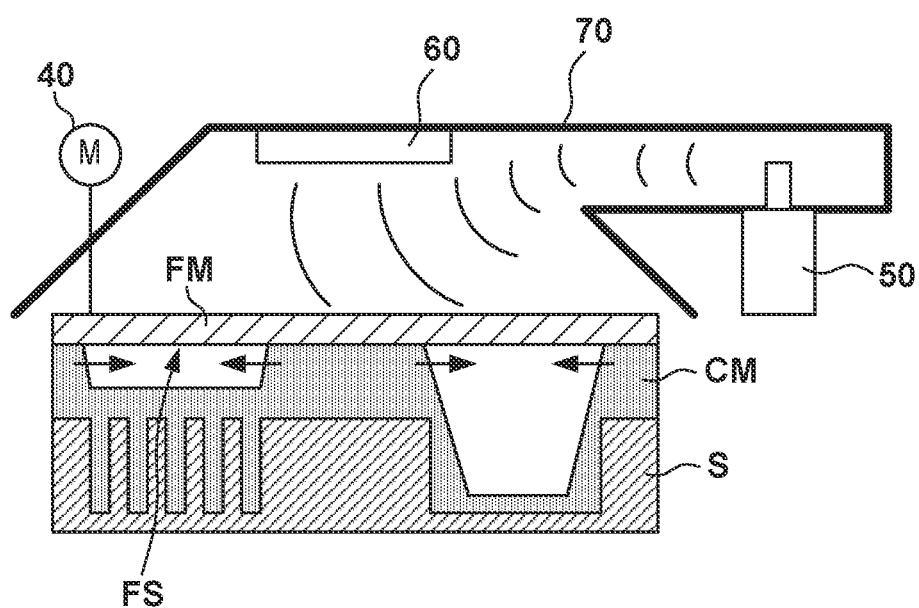
Figure 5A:
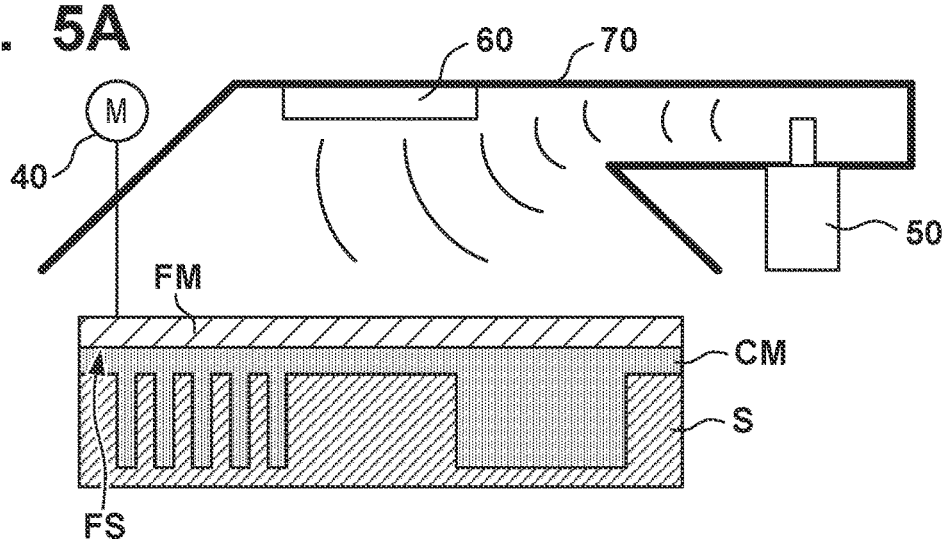
FIGS. 5A to 5C are views exemplarily showing the structure of the substrate, the changes in the curable composition, the contact and the separation between the curable composition and the flat surface of the flat member, and the like in the film forming method that can be performed by the film forming apparatus according to the first embodiment of the present invention.

Next, as shown in FIG. 2A, the substrate S that has been coated with the curable composition CM is conveyed by the conveyance mechanism (not shown) to the substrate holder 10 arranged at the first position P1, and the substrate S is transferred to the substrate holder 10. Next, as shown in FIG. 2B, the moving mechanism 20 moves the substrate holder 10 from the first position P1 to the second position P2. Next, as shown in FIGS. 2C, 4C, and 5A, a contact process of bringing the curable composition CM and the flat surface FS of the flat member FM into contact with each other by the driver 40 and a heating process of heating the curable composition CM by the heater 50 are executed. As described above, the heating of the curable composition CM by the heater 50 may be started before the driver 40 brings the curable composition CM and the flat surface FS of the flat member FM into contact with each other or started after the driver 40 has brought the curable composition CM and the flat surface FS of the flat member FM into contact with each other. The heater 50 can heat the curable composition CM at least during a period in which the curable composition CM and the flat surface FS of the flat member FM are in contact with each other. The heater 50 can heat the curable composition CM to, for example, a temperature that falls within a temperature ranging from 100° C. to 200° C. Heating the curable composition CM reduces the viscosity of the curable composition CM and allows the curable composition CM to reflow more easily, thus promoting planarization by the flat member FM as a result.

The flat member FM is made of, for example, quartz or borosilicate glass plate, and has a thickness that falls within the range of 0.3 mm to 1.0 mm. The flat surface FS of the flat member FM can conform to the surface profile having a large cycle of the substrate S. In one example, the flat surface FS can have a flatness equal to or less than ±1 nm in a 26×7 mm region corresponding to the exposure slit region of the scanning exposure apparatus that may be used in a photo-lithographic process, which is a process that follows after the film forming process. A film formed by the film forming process can conform to the flat surface FS. A film formed by the film forming process need not have a completely flat surface and suffices to have a flatness required for the exposure slit region of a scanning exposure apparatus used in the subsequent photolithography process to be performed. A focus tracking function of the scanning exposure apparatus can be used to cope with the surface profile having a large cycle over the entire substrate S.

For example, the curing device 60 can be formed to irradiate the curable composition CM with ultraviolet light of a wavelength range of 310 nm to 370 nm to cure the curable composition CM. The flat member FM can be formed to transmit at least a part of the ultraviolet light. The driver 40 causes a pressing force to act between the curable composition CM and the flat member FM so that the curable composition CM arranged on the substrate S and the flat surface FS of the flat member FM will be in contact with each other. When the curable composition CM and the flat surface FS are in contact with each other, a capillary action occurs in the curable composition CM. Hence, the curable composition CM and the flat surface FS can become closer to each other by the pressing force and the capillary action. This can eliminate the gap between the curable composition CM and the flat surface FS. The gap can be eliminated effectively by performing the contact process under an environment in which the space between the substrate S (curable composition CM) and the flat member FM is filled with helium. The gap can be eliminated more effectively by coating the flat surface FS with a porous film in advance because helium would be exhausted through the porous film. Cytop® is suitable as the porous film.

Figure 3A:
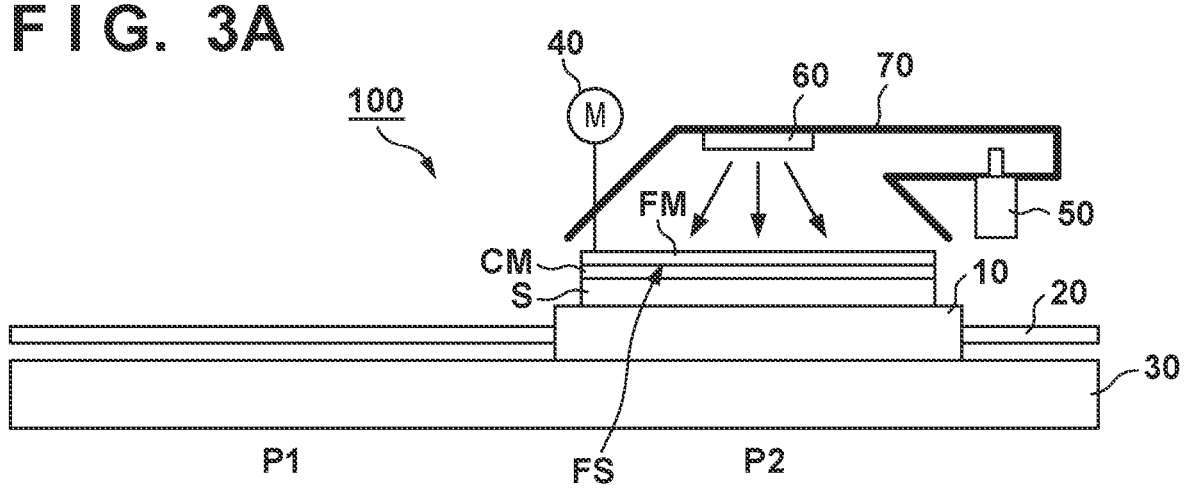
FIGS. 3A to 3C are views exemplarily showing the film forming method that can be performed by the film forming apparatus according to the first embodiment of the present invention.
Figure 3B:
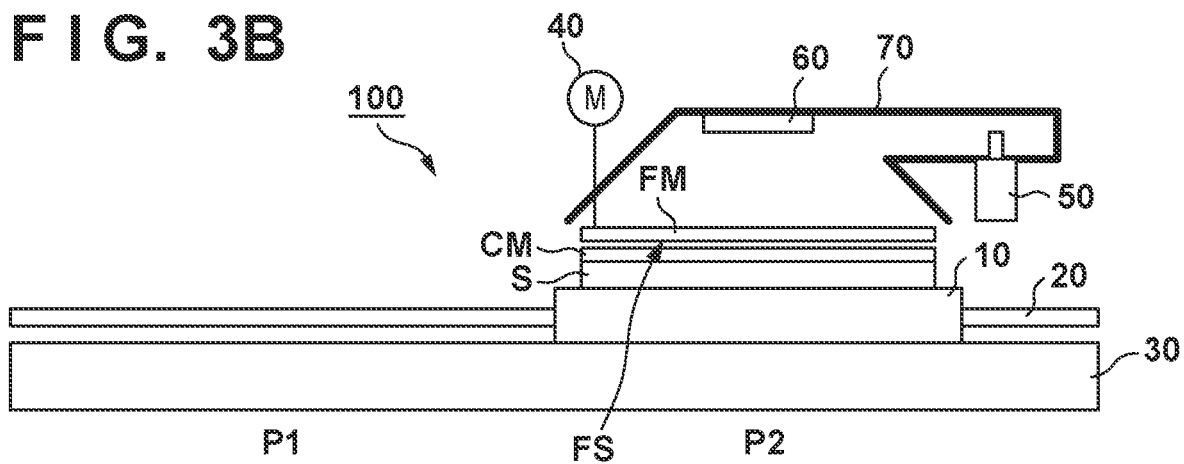
Figure 3C:
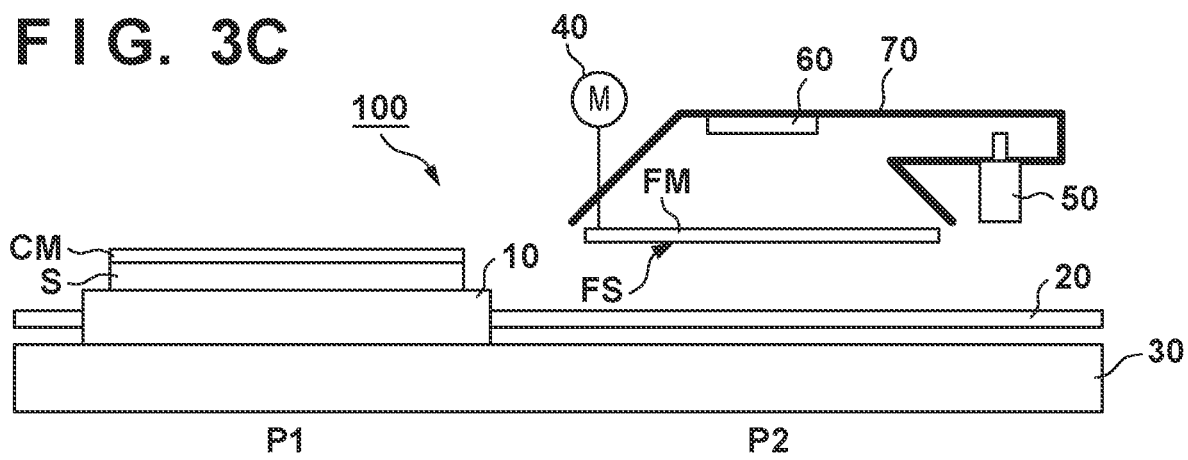
Figure 5B:
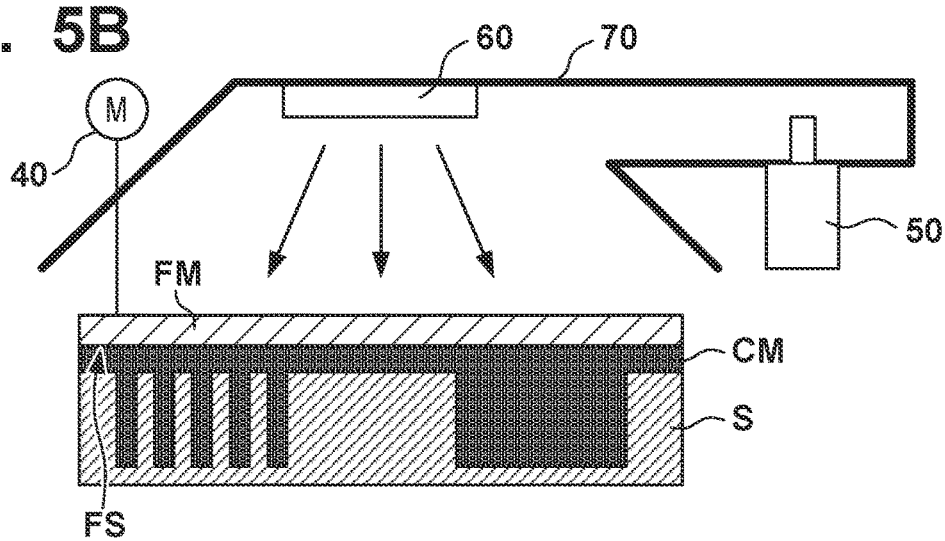
Figure 5C:
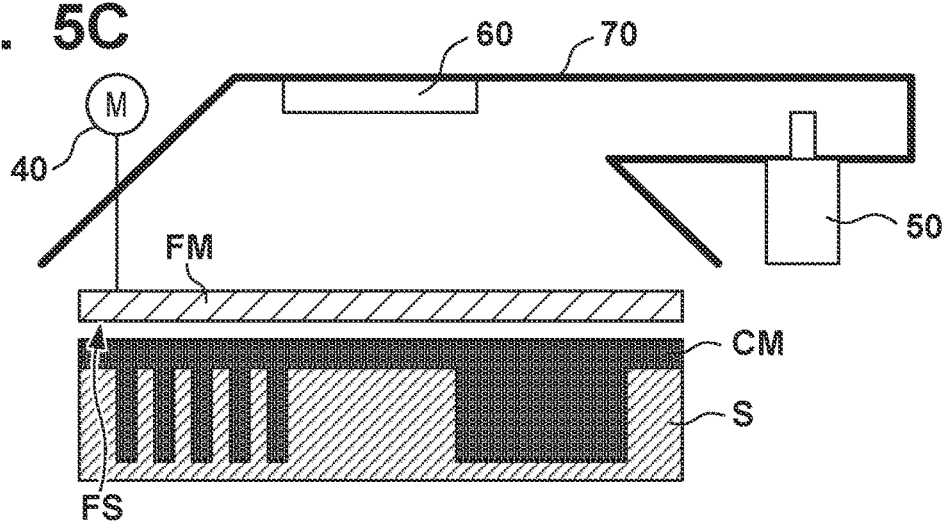

Next, as shown in FIGS. 3A and 5B, the curing device 60 irradiates ultraviolet light on the curable composition CM between the substrate S and the flat member FM and cures the curable composition CM. Next, as shown in FIGS. 3B and 5C, the driver 40 separates the film made of the cured product of the curable composition CM from the flat surface FS. As a result, a film made of the cured product of the curable composition CM will remain on the substrate S. Next, as shown in FIG. 3C, the substrate S on which a film made of the cured product of the curable composition CM is formed is moved by the moving mechanism 20 from the second position P2 to the first position P1. Subsequently, the conveyance mechanism (not shown) removes the substrate S from the substrate holder 10 arranged on the first position P1.

As described above, the film forming method that can be performed by the film forming apparatus 100 according to the first embodiment can include a process of bringing the curable composition CM arranged on the substrate S and the flat surface FS into contact with each other. In addition, the film forming method can also include a heating process in which the curable composition CM is heated by electromagnetic waves to reduce the viscosity of the curable composition CM to make the curable composition CM conform to the flat surface FS. Furthermore, the film forming method can include a process of forming a film made of a cured product of curable composition CM by curing the curable composition CM in a state in which the curable composition CM conforms to the flat surface FS.

Figure 6:
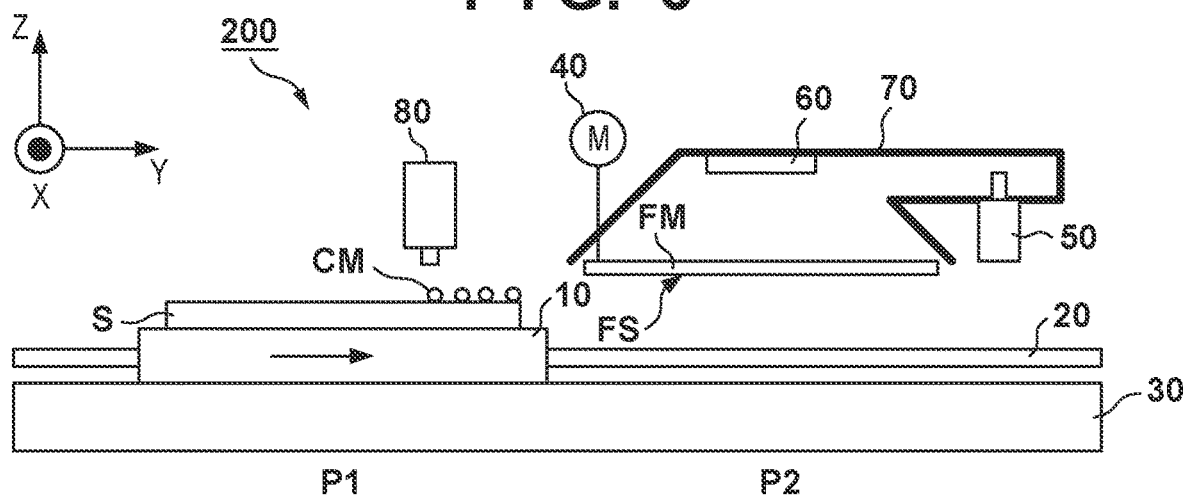
FIG. 6 is a view showing the arrangement of a film forming apparatus according to the second embodiment of the present invention.

FIG. 6 shows the arrangement of a film forming apparatus 200 according to the second embodiment of the present invention. The film forming apparatus 200 according to the second embodiment can have an arrangement similar to that of a film forming apparatus 100 according to the first embodiment other than the point that the film forming apparatus according to the second embodiment includes a dispenser (supplier) 80 for applying or arranging a curable composition CM on a substrate S. Matters not mentioned in the second embodiment are in accordance with those described in the first embodiment. The dispenser 80 can include an orifice of discharging the curable composition CM. The curable composition CM can be arranged at each target position on the substrate S by causing the dispenser 80 to discharge the curable composition CM from the orifice while the substrate S is moved by a moving mechanism 20. This discharge operation can be controlled in accordance with the control information (map) designating a plurality of positions where the curable composition CM is to be arranged on the substrate S. Instead of discharging the curable composition CM from the orifice of the dispenser 80 while moving the substrate S, the curable composition CM may be discharged from the orifice of the dispenser 80 while moving the dispenser 80. That is, the curable composition CM can be arranged on the substrate S by discharging the curable composition CM from the orifice of the dispenser 80 while changing the relative position between the substrate S and the dispenser 80 (orifice).

Figure 7:
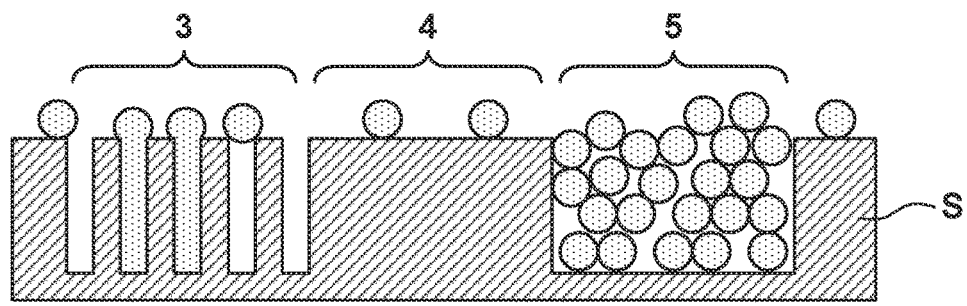
FIG. 7 is a view showing an application example of a curable composition on a substrate by a dispenser of the film forming apparatus according to the second embodiment of the present invention.

As shown in FIG. 7, the surface of the substrate S can include a high density region 3 having a high pattern density, an open region 4 forming the upper surface of a convex portion, and a bathtub region 5 forming the lower surface of a concave portion. The control information described above can be generated so that the density of the curable composition CM will be low in the open region 4, the density of the curable composition CM will be high in the bathtub region 5, and the density of curable composition CM in the high density region 3 will be a density at the midpoint of these densities. That is, the control information used to designate the plurality of positions where the curable composition CM is to be arranged on the substrate can be determined in accordance with the pattern of the substrate S.

Instead of the dispenser 80 described above, the film forming apparatus 200 may include a spin coater that spin-coats the substrate S with the curable composition CM.

Figure 8:
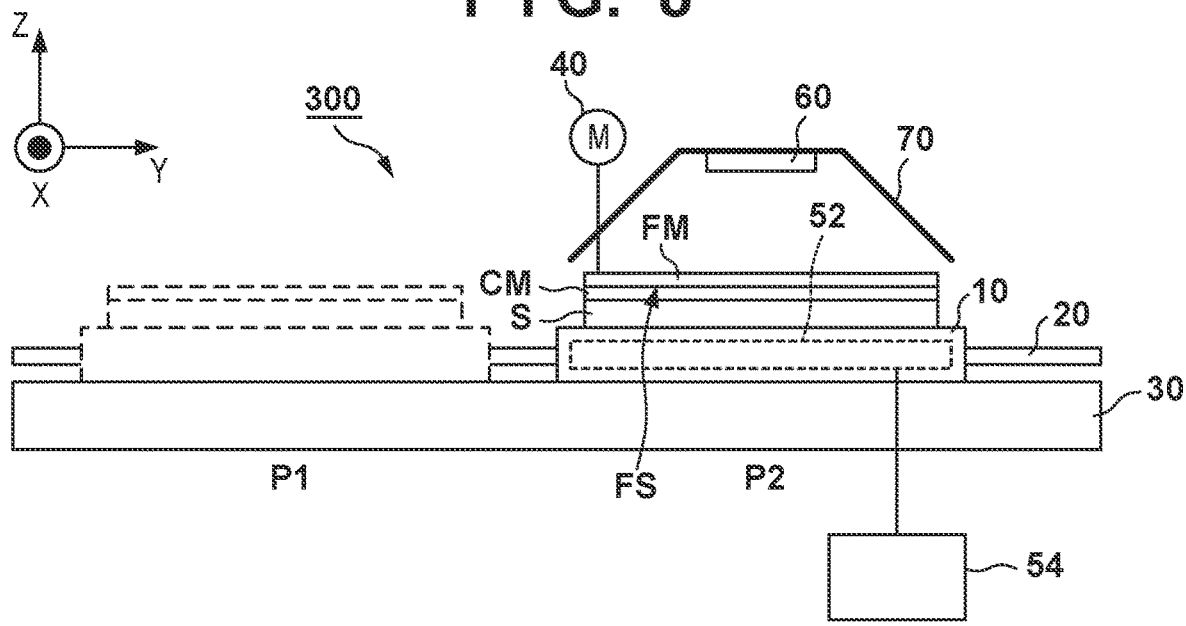
FIG. 8 is a view showing the arrangement of a film forming apparatus according to the third embodiment of the present invention.

FIG. 8 shows the arrangement of a film forming apparatus 300 according to the third embodiment. The film forming apparatus 300 according to the third embodiment has an arrangement in which a heater 50 of a film forming apparatus 100 according to the first embodiment has been replaced by a heater 52. Matters not mentioned in the third embodiment are in accordance with those described in the first and second embodiments. The heater 52 can heat a curable composition CM via a substrate S to reduce the viscosity of the curable composition CM arranged on the substrate S and make the curable composition CM conform to a flat surface FS of a flat member FM. The heater 52 can include, for example, a heater that converts electric power into heat. The heater 52 can be arranged on the substrate holder 10. The film forming apparatus 300 can include a heating controller 54 for controlling the heater 52. The heating controller 54 can control the heater 52 so that a substrate holding surface of a substrate holder 10 will be maintained at a target temperature in a state in which the substrate holder 10 is arranged at a first position to receive the substrate S from a conveyance mechanism (not shown). The heating controller 54 can also control the heater 52 so that the substrate holding surface of the substrate holder 10 will be maintained at the target temperature from a period after the substrate holder 10 has received the substrate S from the conveyance mechanism (not shown) until the curable composition CM conforms to the flat surface at a second position P2. The target temperature can be a temperature that falls within the range of 100° C. to 200° C.

A film forming method that can be performed by the film forming apparatus 100 according to the third embodiment can include a process of heating the substrate holder 10 which holds the substrate S and a process of arranging the substrate S on the substrate holder 10. The film forming method can also include a process of bringing the curable composition CM arranged on the substrate S and the flat surface FS of the flat member FM into contact with each other. As a result of these processes, the curable composition CM is heated via the substrate S by the heating of the substrate holder 10, and the curable composition CM can conform to the flat surface FS because the viscosity of the curable composition CM has decreased. In addition, the film forming method can include a process of forming a film made of a cured product of the curable composition by curing the curable composition in a state in which the curable composition CM conforms to the flat surface FS.

Figure 9:
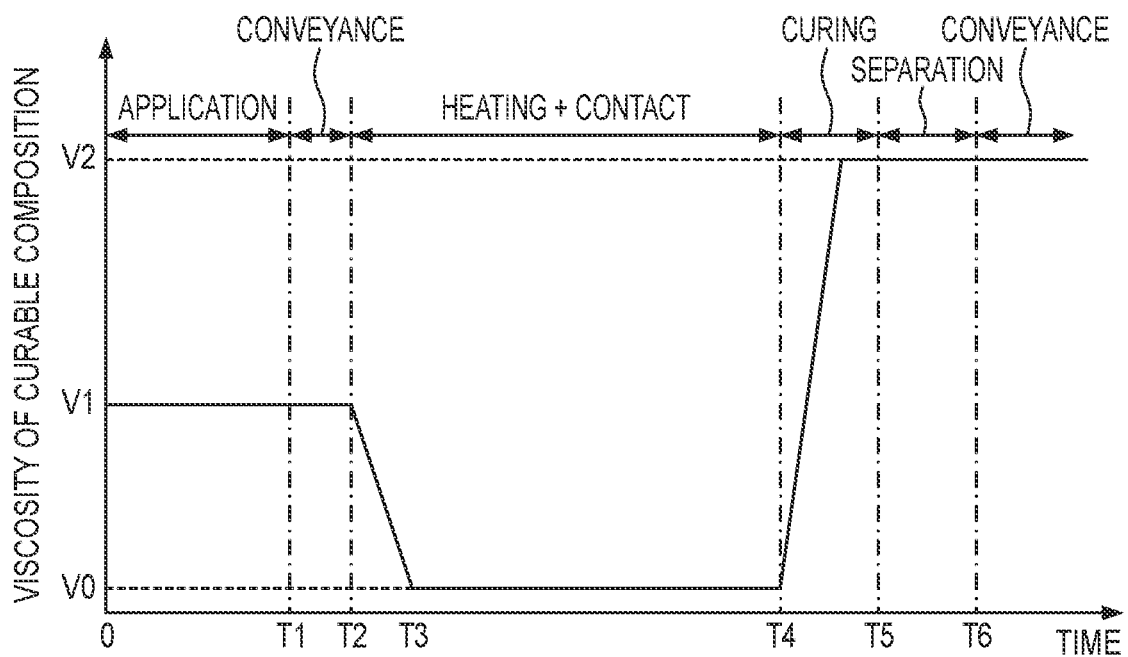
FIG. 9 is a chart exemplarily showing the change in the viscosity of a curable composition according to the first to third embodiments of the present invention.

FIG. 9 shows an example of changes in the viscosity of the curable composition CM according to the first to third embodiments. In the first embodiment and the third embodiment, the curable composition CM is applied or arranged on the substrate S by a coater such as a spin coater or the like set outside the film forming apparatus 100 or 300, and the substrate S applied with the curable composition CM is conveyed to the substrate holder 10 arranged at a first position P1, and the substrate holder 10 is conveyed to the second position P2. In a case in which a spin coater is used, the viscosity of the curable composition CM when the curable composition is applied to the substrate S can typically fall in the range of 103 to 106 (Pa×S). In the second embodiment, the curable composition CM is applied or arranged on the substrate S by the dispenser 80.

In the first embodiment, a period from time 0 to time T1 is the application period by the coater, and a period from time T1 to time T2 is a period in which the substrate S is conveyed from the coater to the first position P1 and the substrate holder 10 (substrate S) is conveyed from the first position P1 to the second position P2. Subsequently, when heating by the heater 50 is started, the viscosity of the curable composition CM starts to decrease from a viscosity V1. Concurrently with the heating operation, the driver 40 operates so as to bring the curable composition CM into contact with the flat surface FS of the flat member FM. Subsequently, the viscosity of the curable composition CM changes to a target viscosity V0, and the curing device 60 cures the curable composition CM in a state in which the curable composition CM conforms to the flat surface FS. As result, the curable composition CM is cured, and the viscosity of the curable composition CM increases to a viscosity V2. Subsequently, the flat surface FS is separated from the cured curable composition CM, and the substrate holder 10 (substrate S) is conveyed from the second position P2 to the first position.

In the second embodiment, a period from time 0 to time T1 is the application period by the dispenser 80, and a period from time T1 to time T2 is a period in which the substrate holder 10 (substrate S) is conveyed from the position where the application by the dispenser 80 has been completed to the second position P2. Subsequently, after the heating operation is started by the heater 50, the viscosity of the curable composition CM starts to decrease from the viscosity V1. Concurrently with the heating operation, the driver 40 operates to bring the curable composition CM and the flat surface FS of the flat member FM into contact with each other. Subsequently, the viscosity of the curable composition CM reaches the target viscosity V0, and the curing device 60 cures the curable composition CM in a state in which the curable composition CM conforms to the flat surface FS. As a result, the curable composition CM is cured, and the viscosity increase to the viscosity V2. Subsequently, the flat surface FS is separated from the cured curable composition CM, and the substrate holder 10 (substrate S) is conveyed from the second position P2 to the first position.

In the third embodiment, a period from time 0 to time T1 is an application period by the coater, and a period from time T1 to time T2 is a period in which the substrate S is conveyed from the coater to the first position P1. In the third embodiment, heating of the curable composition CM on the substrate S is started when the substrate S is held by the substrate holder 10. When the heating by the heater 50 is started, the viscosity of the curable composition CM starts to decrease from the viscosity V1. Concurrently with this heating operation, the substrate holder 10 is conveyed from the first position P1 to the second position P2, and the driver 40 operates to bring the curable composition CM and the flat surface FS of the flat member FM into contact with each other. Subsequently, the viscosity of the curable composition CM reaches the target viscosity V0, and the curing device 60 cures the curable composition CM in a state in which the curable composition CM conforms to the flat surface FS. As a result, the curable composition CM is cured, and the viscosity of the curable composition CM increases to the viscosity V2. Subsequently, the flat surface FS is separated from the cured curable composition CM, and the substrate holder 10 (substrate S) is conveyed from the second position P2 to the first position.

Figure 10:
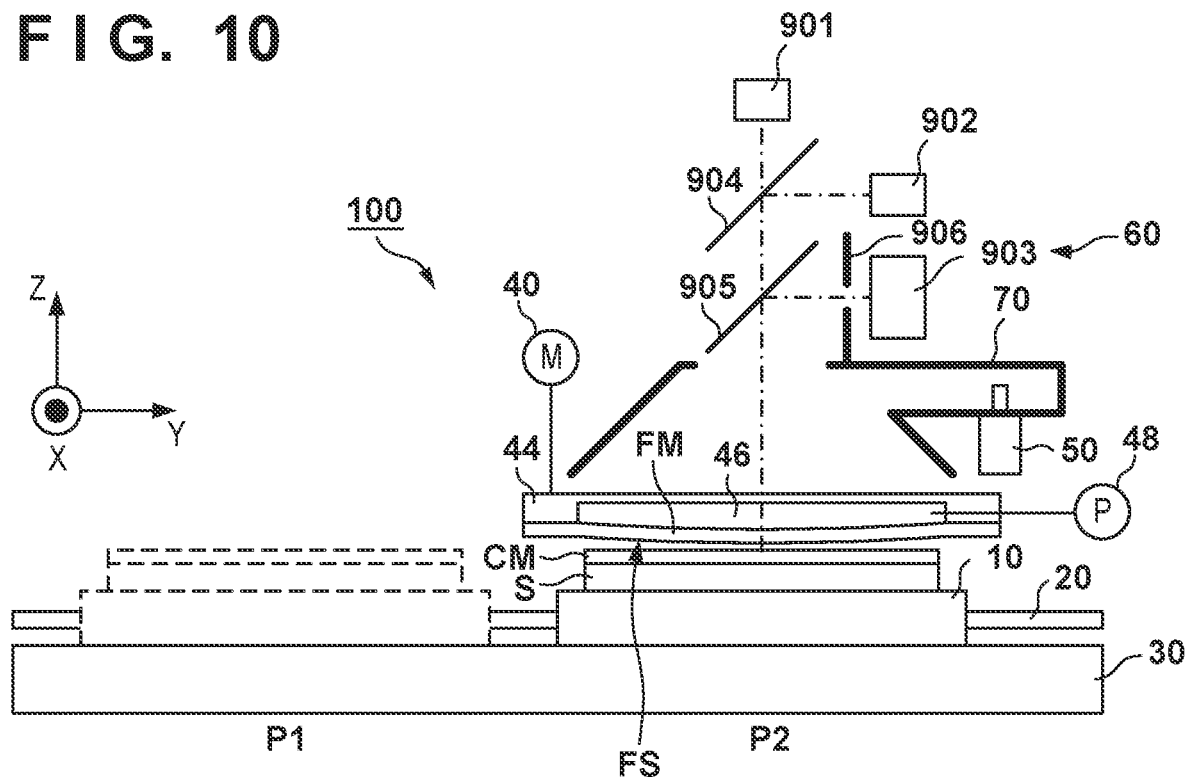
FIG. 10 is a view for explaining a modification of the film forming apparatus according to the first to third embodiments of the present invention.

In the first to third embodiments, the entire optical path or a part of the optical path of the curing device 60 can be arranged in common with the entire optical path or a part of the optical path of a camera for observing the state of the curable composition CM set between the substrate S and the flat member FM. An example in which an arrangement obtained by arranging the entire optical path or a part of the optical path of the curing device 60 in common with the optical path of the camera is applied to the film forming apparatus 100 according to the first embodiment will be described hereinafter with reference to FIG. 10. Note that such arrangement is applicable to the film forming apparatus 200 according to the second embodiment and the film forming apparatus 300 according to the third embodiment.

The film forming apparatus 100 can include a camera 901 for observing the state of the curable composition CM arranged between the substrate S and the flat member FM. The camera 901 can be used to control, for example, the orientation (the rotation about the X-axis and the rotation about the Y-axis according to the coordinate axes described in FIG. 10) of the flat member FM when the flat surface FS of the flat member FM and the curable composition CM are to be brought into contact with each other. Alternatively, the camera 901 is used to confirm that the space between the substrate S and the flat member FM has been filled without a gap by the curable composition CM.

The curing device 60 can include an ultraviolet light source 903 that generates ultraviolet light for curing the curable composition CM. The ultraviolet light emitted from the ultraviolet light source 903 is reflected by a dichroic mirror 905, enters the curable composition CM on the substrate S, and cures the curable composition CM. The dichroic mirror 905 can be arranged, for example, to reflect light of a wavelength range (for example, light whose wavelength is equal to or less than 380 nm) of ultraviolet light emitted from the ultraviolet light source 903, and transmit light of a wavelength range exceeding this light.

The film forming apparatus 100 can also include an observation light source 902 for observation by the camera 901. The observation light source 902 can be formed by, for example, a red LED and can generate light which has a peak at a wavelength of 630 nm. Light emitted from the observation light source 902 is reflected by a half mirror 904, transmitted through the dichroic mirror 905, and illuminates the curable composition CM. The reflected light from the curable composition CM, which is illuminated by the light from the observation light source 902, is transmitted through the dichroic mirror 905 and the half mirror 904, enters the camera 901, and forms an optical image on an image capturing surface (sensor surface). The camera 901 captures the optical image formed on the image capturing surface by the curable composition CM arranged between the substrate S and the flat surface FS.

The image captured by the camera 901 is effective in, for example, detecting a boundary line between a contact region of the curable composition CM and the flat surface FS and a non-contact region outside this region. This boundary line can typically form a closed figure such as a circle. In a case in which the boundary line is not point symmetric or line symmetric, the flat member FM may be tilted relatively to the substrate S. In such a case, calibration can be executed to correct the relative tilt of the flat member FM with respect to the substrate S.

In addition, an image captured by the camera 901 is effective in detecting whether an unfilled region has been generated due to a particle being present between the substrate S and the flat surface FS. The unfilled region is, for example, a region not filled by the curable composition CM due to the presence of the particle.

The curing device 60 can include a movable aperture 906 as a changer that changes the ultraviolet irradiation region of the curable composition on the substrate S. As will be described later with reference to FIG. 11, for example, the movable aperture 906 can be operated to change the ultraviolet irradiation region in accordance with the movement of the above-described boundary line.

The driver 40 can also include a deformation mechanism 48 that deforms, after the curable composition CM on a portion of the film forming region of the substrate S and the flat surface FS of the flat member FM have been brought into contact with each other, the flat member FM to expand the contact region between the curable composition CM and the flat surface FS. Such deformation mechanism 48 can be provided to the driver 40 of the film forming apparatus 100, 200, or 300 according to the first, the second, or the third embodiment. The deformation mechanism 48 can deform the flat member FM by using a holding head 44 for holding the flat member FM to adjust the pressure of a sealed space 46 formed on the back surface side (side opposite to the flat surface FS) of the flat member FM. For example, the pressure of the sealed space 46 can be made higher than a reference pressure to deform the flat surface FS of the flat member FM into a convex shape in a downward (substrate S) direction. As a result, the curable composition CM on a portion of the film forming region of the substrate S and the flat surface FS of the flat member FM can be brought into contact with each other. On the other hand, the flat surface FS of the flat member FM can be flattened by adjusting the pressure of the sealed space 46 to the reference pressure. The reference pressure in this case is a pressure that can flatten the flat surface FS of the flat member FM by canceling the gravity applied to the flat member FM.

Figure 11:
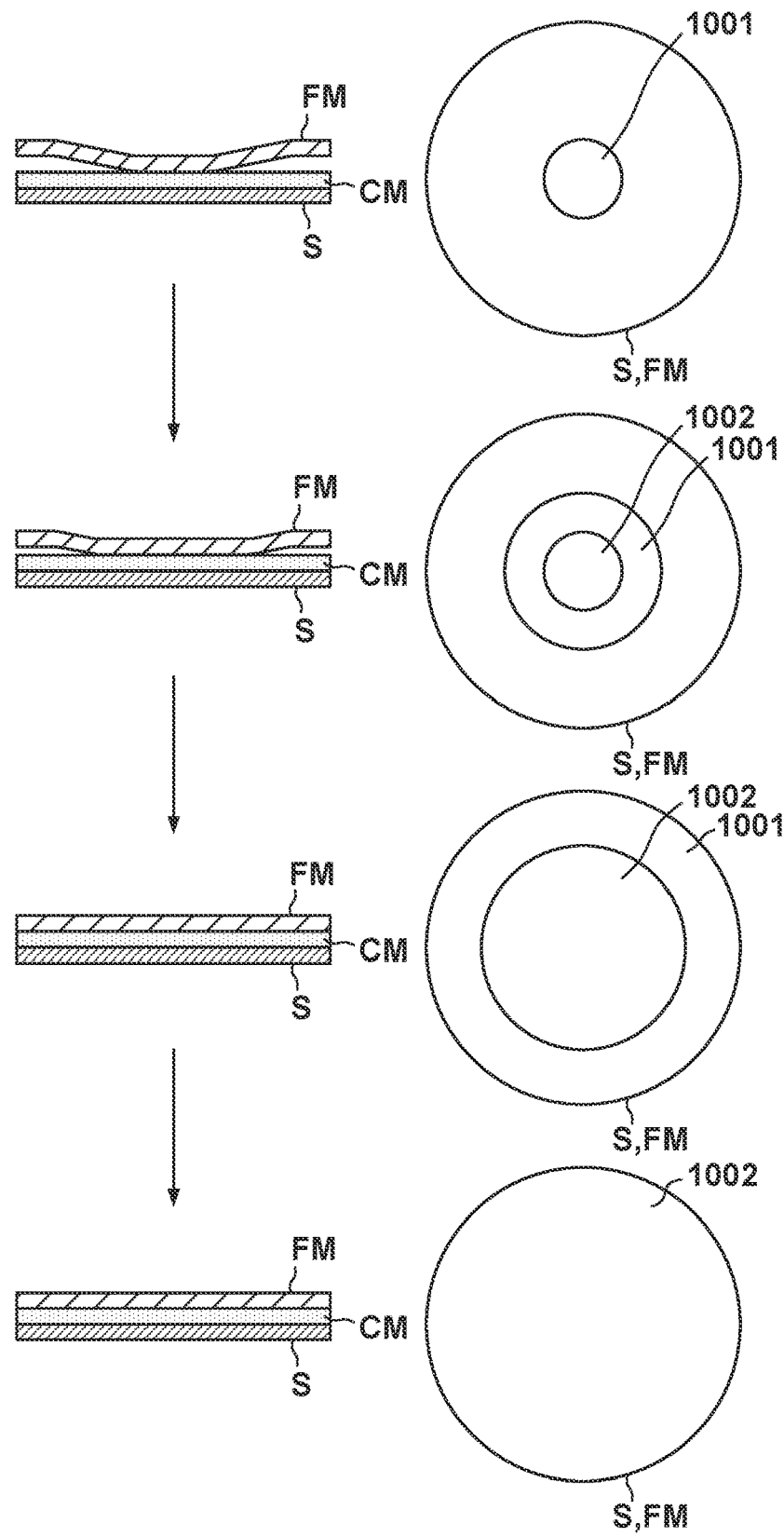
FIG. 11 is a view exemplarily showing a film forming method that can be performed by the modification of the film forming apparatus according to the first to third embodiments of the present invention.

A film forming method that can be applied to the film forming apparatus 100, 200, or 300 that includes the movable aperture 906 and the deformation mechanism 48 described above will be described hereinafter with reference to FIG. 11. In FIG. 11, the contact region between the curable composition CM on the substrate S and the flat surface FS of the flat member FM is indicated as a contact region 1001. Also, an ultraviolet irradiation region defined by the movable aperture 906 is indicated as an irradiation region 1002. In accordance with the first to the third embodiments, the curable composition CM has been heated to reduce its viscosity and conforms easily to the flat surface of the flat member FM.

As indicated by each arrow, the deformation mechanism 48 operates so as to gradually expand the contact region 1001. The movable aperture 906 changes the irradiation region 1002 in accordance with the expansion of the contact region 1001 so that the irradiation region 1002 will be defined sufficiently inside the periphery (boundary line) of the contact region 1001.

A method of manufacturing an article according to an embodiment of the present invention will be described hereinafter. The method of manufacturing an article can include a process of forming a film on the substrate S by the film forming apparatus or a film forming method described above and a process of arranging a photosensitive material on the film on the substrate S. The photosensitive material can be a photoresist. The photoresist can be arranged on the film by using, for example, a coater such as a spin coater. The method of manufacturing an article can also include a process of forming a pattern by exposing the photosensitive material (photoresist film) and a process of processing the substrate S by using the pattern. The exposing of the photosensitive material is performed by using an exposure apparatus, preferably a scanning exposure apparatus. Alternatively, the exposing of the photosensitive material can be performed by an imprint apparatus. More specifically, the imprint apparatus can form a pattern made of a cured product of the photosensitive material by bringing the photosensitive material on the substrate and a mold into contact with each other and curing the photosensitive material by exposing the photosensitive material. An article is manufactured from the substrate S which has undergone the above processes by the method of manufacturing an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-192812, filed Oct. 11, 2018, which is hereby incorporated by reference herein in its entirety.

What is claimed is:

1. A film forming apparatus that forms a film on a substrate, comprising:
   a substrate holder configured to hold the substrate;
   a driver configured to bring a curable composition arranged on the substrate and a flat surface into contact with each other;
   a heater configured to heat the curable composition by electromagnetic waves to reduce the viscosity of the curable composition and make the curable composition conform to the flat surface;
   a curing device configured to form a film made of a cured product of the curable composition by curing the curable composition in a state in which the curable composition conforms to the flat surface; and a moving mechanism configured to arrange the substrate holder at a first position and a second position, wherein the first position is a position where the substrate holder receives the substrate, and the second position is a position where the curing device cures the curable composition.

2. The apparatus according to claim 1, wherein the heater includes a magnetron.

3. The apparatus according to claim 2, wherein the magnetron generates electromagnetic waves having a frequency of 2.45 GHz or 0.915 GHz.

4. A film forming apparatus that forms a film on a substrate, comprising:

a substrate holder configured to hold the substrate;
a driver configured to bring a curable composition arranged on the substrate and a flat surface into contact with each other;
a heater provided to the substrate holder and configured to heat the curable composition via the substrate to reduce the viscosity of the curable composition and make the curable composition conform to the flat surface;
a curing device configured to form a film made of a cured product of the curable composition by curing the curable composition in a state in which the curable composition conforms to the flat surface; and
a moving mechanism configured to arrange the substrate holder at a first position and a second position,
wherein the first position is a position where the substrate holder receives the substrate, and the second position is a position where the curing device cures the curable composition.

5. The apparatus according to claim 1, wherein the heater heats the curable composition to a temperature which falls in a temperature ranging from 100° C. to 200° C.

6. The apparatus according to claim 4, wherein the heater heats the curable composition to a temperature which falls in a temperature ranging from 100° C. to 200° C.

7. The apparatus according to claim 1, wherein the substrate includes a plurality of shot regions, and the flat surface is of a size that can cover the entire plurality of shot regions.

8. The apparatus according to claim 4, wherein the substrate includes a plurality of shot regions, and the flat surface is of a size that can cover the entire plurality of shot regions.

9. The apparatus according to claim 1, further comprising:
a supplier configured to supply the curable composition on the substrate,
wherein the supplier supplies the curable composition on the substrate while the moving mechanism moves the substrate holder from the first position to the second position.

10. The apparatus according to claim 4, further comprising:
a supplier configured to supply the curable composition on the substrate.

11. The apparatus according to claim 9, wherein the supplier includes an orifice configured to discharge the curable composition, and arranges the curable composition on the substrate by discharging the curable composition from the orifice while changing a relative position between the substrate and the orifice.

12. The apparatus according to claim 10, wherein the supplier includes an orifice configured to discharge the curable composition, and arranges the curable composition on the substrate by discharging the curable composition from the orifice while changing a relative position between the substrate and the orifice.

13. The apparatus according to claim 9, wherein the supplier includes a spin coater configured to spin-coat the substrate with the curable composition.

14. The apparatus according to claim 10, wherein the supplier includes a spin coater configured to spin-coat the substrate with the curable composition.

15. The apparatus according to claim 13, wherein the supplier arranges the curable composition on the substrate based on control information determined in accordance with a pattern of the substrate.

16. The apparatus according to claim 14, wherein the supplier arranges the curable composition on the substrate based on control information determined in accordance with a pattern of the substrate.

17. The apparatus according to claim 1, wherein the curing device cures the curable composition by ultraviolet light.

18. The apparatus according to claim 17, wherein the curing device includes a changer configured to change an ultraviolet irradiation region of the curable composition on the substrate.

19. The apparatus according to claim 18, wherein the driver expands, after bringing the curable composition on a portion of a film forming region of the substrate into contact with the flat surface, a contact region between the curable composition and the flat surface, and the curing device changes the ultraviolet irradiation region in accordance with the expansion of the contact region.

20. A method of manufacturing an article, the method comprising:

forming a film made of a cured product of a curable composition on a substrate by a film forming apparatus defined in claim 1;
arranging a photosensitive material on the film;
forming a pattern by exposing the photosensitive material; and
processing the substrate by using the pattern,
wherein the article is manufactured from the substrate.

21. A method of manufacturing an article, the method comprising:

forming a film made of a cured product of a curable composition on a substrate by a film forming apparatus defined in claim 4;
arranging a photosensitive material on the film;
forming a pattern by exposing the photosensitive material; and
processing the substrate by using the pattern,
wherein the article is manufactured from the substrate.

22. A film forming method for forming a film on a substrate, the method comprising:

arranging the substrate on a substrate holder;
bringing a curable composition arranged on the substrate and a flat surface into contact with each other;
heating the curable composition by electromagnetic waves to reduce the viscosity of the curable composition and make the curable composition conform to the flat surface;
forming a film made of a cured product of the curable composition by curing the curable composition in a state in which the curable composition conforms to the flat surface; and
moving the substrate holder between a first position and a second position, wherein the first position is a position where the substrate holder receives the substrate in the arranging the substrate on the substrate holder, and the second position is a position where the curing device cures the curable composition in the forming a film.

23. A film forming method for forming a film on a substrate, the method comprising:
heating a substrate holder configured to hold the substrate;
arranging the substrate on the substrate holder;
bringing a curable composition arranged on the substrate and a flat surface into contact with each other;
forming a film made of a cured product of the curable composition by curing the curable composition in a state in which the curable composition has been heated via the substrate in the heating of the substrate holder to reduce the viscosity of the curable composition and make the curable composition conform to the flat surface; and
moving the substrate holder between a first position and a second position,
wherein the first position is a position where the substrate holder receives the substrate in the arranging the substrate on the substrate holder, and the second position is a position where the curing device cures the curable composition in the forming a film.

24. A method of manufacturing an article, the method comprising:
forming a film made of a cured product of a curable composition on a substrate by a film forming method defined in claim 22;
arranging a photosensitive material on the film;
forming a pattern by exposing the photosensitive material; and
processing the substrate by using the pattern,
wherein the article is manufactured from the substrate.

25. A method of manufacturing an article, the method comprising:
forming a film made of a cured product of a curable composition on a substrate by a film forming method defined in claim 23;
arranging a photosensitive material on the film;
forming a pattern by exposing the photosensitive material; and
processing the substrate by using the pattern,
wherein the article is manufactured from the substrate.

26. A film forming apparatus that forms a film on a substrate, comprising:
a substrate holder configured to hold the substrate;
a driver configured to bring a curable composition arranged on the substrate and a flat surface into contact with each other;
a heater configured to heat the curable composition to reduce the viscosity of the curable composition and make the curable composition conform to the flat surfaces;
a curing device configured to form a film made of a cured product of the curable composition by curing the curable composition in a state in which the curable composition conforms to the flat surface; and
a moving mechanism configured to arrange the substrate holder at a first position and a second position,
wherein the first position is a position where the substrate holder receives the substrate, and the second position is a position where the curing device cures the curable composition.

* * * * *